United States Patent [19]

Freller et al.

[11] Patent Number: 5,061,684
[45] Date of Patent: Oct. 29, 1991

[54] PRODUCTION OF THIN LAYERS OF A HIGH TEMPERATURE SUPERCONDUCTOR (HTSC) BY A PLASMA-ACTIVATED PHYSICAL VAPOR DEPOSITION PROCESS, AND CATHODES USED THEREIN

[75] Inventors: Helmut Freller, Roethenbach; Peter Schack, Nurenberg, both of Fed. Rep. of Germany

[73] Assignee: Siemens Aktiengesellschaft, Berlin & Munich, Fed. Rep. of Germany

[21] Appl. No.: 412,082

[22] Filed: Sep. 25, 1989

[30] Foreign Application Priority Data

Sep. 29, 1988 [DE] Fed. Rep. of Germany ....... 3833132

[51] Int. Cl.$^5$ .............. H01L 39/12; B05D 3/06
[52] U.S. Cl. ........................... 545/1; 427/37; 204/192.38
[58] Field of Search ............ 204/192.24, 192.38; 505/1, 730, 732; 427/37, 38

[56] References Cited

U.S. PATENT DOCUMENTS

| | | | |
|---|---|---|---|
| 4,654,231 | 3/1987 | Nyberg et al. | 427/255.3 |
| 4,877,505 | 10/1989 | Bergmann | 204/192.38 |
| 4,917,786 | 4/1990 | Ehrich | 204/192.38 |
| 4,919,968 | 4/1990 | Buhl et al. | 427/37 |

FOREIGN PATENT DOCUMENTS

| | | |
|---|---|---|
| 0107325 | 5/1984 | European Pat. Off. |
| 0284489 | 9/1988 | European Pat. Off. |
| 3627151 | 2/1988 | Fed. Rep. of Germany |

OTHER PUBLICATIONS

"$Ti_xAl_{1-x}N$ Films Deposited by Ion Plating with an Arc Evaporator" by H. Freller and H. Haessler.
"Progress in Physical Vapour Deposited Wear Resisting Coatings on Tools and Components" by H. Freller, K. G. Gunther, and H. Hassler.
Ishiwara et al., "Preparation . . . Method", Jap. Journal of Appl. Physics, vol. 28, No. 5, 5/89, pp. 816–818.
Ginley et al., "Sequential . . . 97K", Appl. Physics Lett., 53(5), Aug. 1, 1988, pp. 406–408.
Randhawa et al., "Technical . . . Applications", Surf. Coating Techn., 31(1987), 303–318.

*Primary Examiner*—Nam X. Nguyen
*Attorney, Agent, or Firm*—Kenyon & Kenyon

[57] ABSTRACT

In the process according to the invention, material is vaporized off a cathode and deposited on a substrate in a cathodic arc vaporization process, the arc base being moved on the cathode surface in a random or controlled manner. In the arc vaporization process, preferably at least two cathodes of different alloys or mixtures of the metallic components of the high temperature superconductor (HTSC) are activated for vaporization by an arc and the materials vaporized out of the different alloys are jointly deposited on the substrate, the arc vaporization process occurring reactivity under oxygen atmosphere of preset $O_2$ partial pressure. A heat treatment for adjusting the structure and oxygen stoichiometry suitable for superconduction can be carried out after or during the vaporizing process.

19 Claims, 2 Drawing Sheets

PRODUCTION OF THIN LAYERS OF A HIGH TEMPERATURE SUPERCONDUCTOR (HTSC) BY A PLASMA-ACTIVATED PHYSICAL VAPOR DEPOSITION PROCESS, AND CATHODES USED THEREIN

FIELD OF THE INVENTION

The invention relates to the production of thin layers of a high temperature superconductor (HTSC) by a plasma-activated physical vapor deposition (PVD) process where, in a cathodic process, material is removed from a cathode and deposited on a substrate, and where a structure and oxygen stoichiometry suitable for superconduction is adjusted by a heat treatment. The invention further relates to the cathodes used for the production of the layers.

BACKGROUND OF THE INVENTION

According to the state of the art, for the realization of high temperature superconductors of high current-carrying capacity, these ceramic materials must be present in certain preferred orientations of the microstructure. Until now, it has been possible to produce thin layers of such structure only through deposition from the gas phase. Zirconium dioxide ($ZrO_2$), magnesium oxide (MgO), strontium titanate ($SrTiO_3$) and other materials of adapted coefficients of expansion and lattice structure were primarily used as substrates. On appropriately oriented monocrystal surfaces of these substrate materials, epitaxial growth of the HTSC material is possible.

The production of such thin preferentially oriented layers of the various HTSC materials known until now, such as Y-Ba-Cu-O or Bi-Sr-Ca-Cu-O or Tl-Ba-Ca-Cu-O (without indication of the stoichiometry in each case), has occurred by conventional methods of PVD technology (physical vapor deposition), such as for example by cathode sputtering of sintered HTSC targets by means of DC voltage, high-frequency, and magnetron methods. The production of preferentially oriented layers of high current carrying capacity has also been possible by vaporization of the individual elements from separate crucibles in an oxygen atmosphere as well as by vaporization of HTSC targets with the aid of excimer laser pulses.

An essential precondition for the production of oriented materials at a reasonable cost is a sufficiently fast rate of growth. With the current PVD methods, this rate is so slow that only specific applications in microelectronics enter into consideration. Growth rates as demanded in the practice are reached only with laser vaporization.

It is therefore an object of the invention to provide a method for the production of HTSC layers with which similarly high growth rates as in laser vaporization are obtained. In addition, the cathodes used therein are to be obtained.

SUMMARY OF THE INVENTION

According to the invention, a method for the production of HTSC layers is provided wherein an arc vaporization process is employed wherein the arc base is moved on the cathode surface in a random or a controlled manner. In the arc vaporization process, preferably at least two cathodes of different alloys or mixtures of the metallic components of the high temperature superconductor (HTSC) are activated for vaporization by an arc and the materials vaporized out of the different alloys are deposited jointly on the substrate, the arc vaporization process occurring reactively under oxygen atmosphere of a given $O_2$ partial pressure.

Further details and advantages of the invention will become evident from the following detailed description and the embodiment example with reference to the drawings, in which:

FIG. 1 schematically shows the coating installation used, and

FIG. 2 and FIG. 3 show experimental results of layers vapor deposited in the installation of FIG. 1.

DETAILED DESCRIPTION OF THE INVENTION

For the production of thin layers of oxidic high temperature superconductors it is possible in accordance with the invention to start with metallic alloys of the source element. Typical source alloys are, for example, the binary systems Y-Cu and Ba-Cu for the production of Y-Ba-Cu-O layers. Analogously, the binary systems Bi-Sr and Cu-Ca and also the ternary systems Bi-Cu-Sr and Bi-Cu-Ca can be used for the production of Bi-Sr-Ca-Cu-O layers. Accordingly it is possible also to start either with binary systems Tl-Ba and Cu-Ca or with ternary systems Tl-Ba-Cu and Tl-Cu-Ca for the production of Tl-Ba-Ca-Cu-O layers.

For the production of Y-Ba-Cu-O layers the yttrim-copper cathode has, according to the invention, a composition between 40:60 and 60:40, and the barium-copper cathode a composition between 40:60 and 70:30. Preferably both alloy cathodes can have a composition of 50:50 each.

For the production of Bi-Sr-Ca-Cu layers the bismuth-strontium cathode has a composition between 40:60 and 60:40 and the calcium-copper cathode a composition between 80:20 and 50:50. The Bi-Sr alloy cathode may have preferably a composition of 50:50 and the Ca-Cu alloy cathode a composition of 66:34. If, on the other hand, a first cathode of bismuth-copper-strontium and a second cathode of bismuth-copper calcium is used, both alloy cathodes have a composition between 15:70:15 and 25:50:25. In the bismuth-containing alloy cathodes, advantageously, a part of the bismuth may be replaced by lead.

For the production of layers of the two last-named high temperature superconductors (HTSC), three cathodes may also be used as vaporizers if desired. The composition of the individual cathodes should then always be chosen so that all metals of the HTSC compound to be synthesized are contained in the sum and that by correct selection of the vaporizer currents the required stoichiometry of the individual components in the layer can be adjusted. In all cases it is advantageous that the alloy cathodes are easier to handle than the very reactive metals such as yttrium and barium.

In the invention, the temperature control can be such that a heat treatment of the layer under air or oxygen follows the actual vaporization process in a known manner. Or the substrate may be at an appropriately high temperature already during the vaporization process. In addition, a variable accelerating voltage can be applied to the substrate during the vaporization process.

Figure 1:
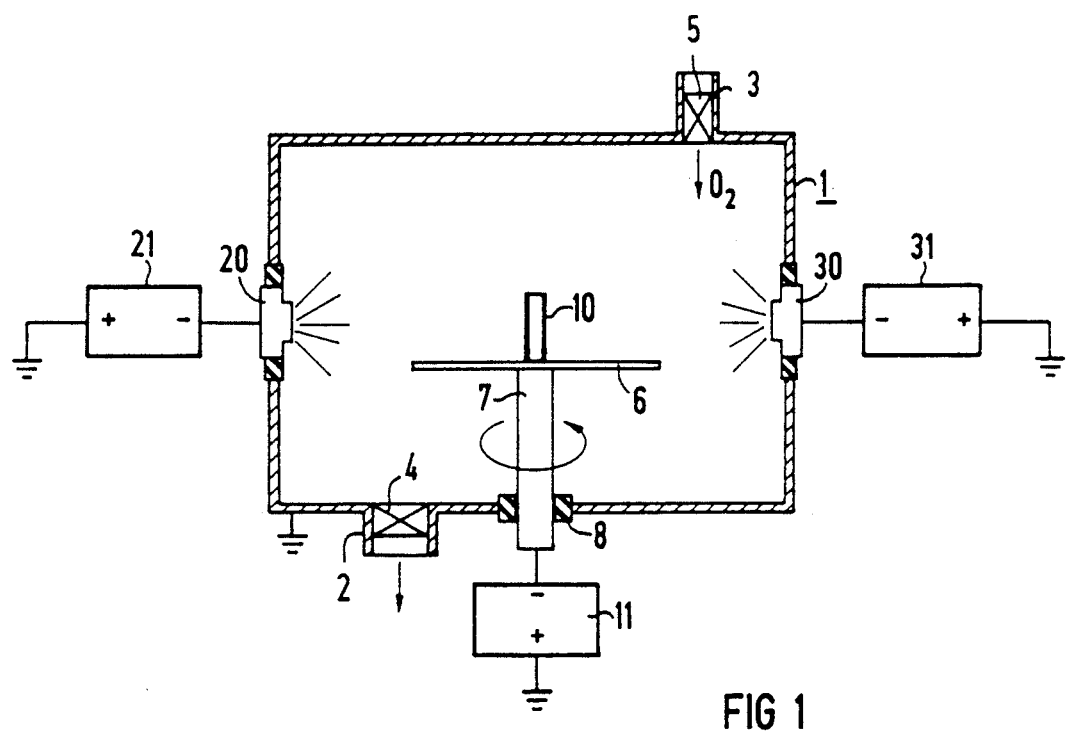

The cathodic arc vaporization process has been used until now mainly for the coating of workpieces with functional hard substance layers, in which connection reference is made to publications in the trade literature (e.g. Thin Solid Films 153 (1987), 67–74, and Annals of the CIRP Vol 37/1/1988). As sources for the arc vaporization process pure metals or alloys enter into consideration. Because of the high power density, advantageously a high growth rate always results. Referring to FIG. 1, a metal vessel 1 is depicted which has a large-volume outlet 2 leading to a vacuum pump (not shown) and a small-volume feed line 3 for supplying reaction gases, whereby, for example, a given oxygen partial pressure can be adjusted. Outlet 2 and feed line 3 have a valve 4 and 5, respectively, valve 5 being designed specifically as a proportioning valve.

Inserted and insulated opposite each other in the metal wall of vessel 1 are two cathodes 20 and 30 of different materials, in particular alloys. Each of the cathodes 20 to 30 is at negative potential against the metal housing of vessel 1, presettable by a voltage source 21.3A between $-15$ and $-40$ V. Thus the metal wall of vessel 1 defines an anode, and between the anode and alloy cathode an arc forms which is activated in a known manner by an igniting electrode. Depending on the design form of the cathodes, the arc moves on the cathode surface in a random or controlled manner and forms on the alloy material one or more bases, so that there the material is activated for vaporization. Due to the short stay of the arc base or bases at a point of the cathode and the high energy density of the arc, extremely small quantities of material are vaporized instantly each time.

In symmetrical arrangement between the two cathodes 20 and 30 is a substrate 10 on the support 6 of a rotary mount 7, which has a rotary leadthrough 8 through the vessel 1. Through a voltage source 11 negative bias voltage of between 0 and 1000 V can be applied to the substrate 10.

When the alloy cathodes are activated for vaporization by the respective arc, particle streams result in the direction of the substrate 10, which are indicated in FIG. 1 by the different arrow directions. In order that both particle streams will hit the substrate 10 uniformly, the substrate holder 7 is set in rotation. Alternatively, a vessel with cathodes may be constructed so that both or several particle streams can be directed onto the substrate 10 simultaneously even without rotation.

Associated with the substrate support 6 may be a heating device for the substrate 10 by which the substrate 10 can be heated to a presettable temperature. Such a heating device, not shown in FIG. 1, can act in particular as a radiation heater.

In the apparatus described according to FIG. 1, more than two cathodes may be provided. Thus, different vaporizers of various concentrations can be set up, the particle streams being able to be varied by the voltage applied to the cathode. Further, a reaction gas can be introduced into the vessel 1 after evacuation, so that the vaporization takes place reactively. In particular, a presettable oxygen partial pressure is desirable for the intended purpose.

In an apparatus according to FIG. 1, thin layers of a high temperature superconductor (HTSC) can be deposited on the substrate 10 if alloy cathodes of appropriate composition and suitable limit conditions during vaporization are chosen. High temperature superconductors (HTSC) with transition temperatures above the boiling point of liquid nitrogen (77 K) are at present known on a base of yttrium, bismuth and thallium and are compiled as examples in Table 1 with their respective stoichiometry.

In Example 1 it appears that for obtaining the superconducting phase of the stoichhometry $YBa_2Cu_cO_{7-\delta}$ two alloy cathodes with one cathode of yttrium-copper and the other cathode of barium-copper should be chosen. In the further examples, where the high temperature superconductor has in each instance at least four metallic components, different possibilities for the number and type of alloy cathodes are conceivable, and it may then be reasonable to use three cathodes.

Under the studies on which the invention is based, Example 1 was examined specifically. For the alloy cathode of YCu a concentration of 50:50 in per cent by weight and for the alloy cathode of BaCu a concentration of 64:36 in per cent by weight were chosen.

In the apparatus of FIG. 1 the operation was carried out in an oxygen atmosphere at an $O_2$ partial pressure of 2 pascals. If the vaporizer currents were chosen correctly there resulted on the sustrate 10, alternately facing the two sources, an HTSC layer which subsequently was additionally tempered under oxygen at a temperature of 900° C. Alternatively, with deposition on a heated substrate, the oxygen required for adjustment of a stoichiometry suitable for high temperature superconduction can be absorbed during cooling in an oxygen atmosphere.

Preferentially oriented layers on zirconium oxide were produced having a thickness of 1 to 1.5/um. Due to the high energy density in arc vaporization, growth rates result in the order of 1 to 2 nm per second, so that such layer thicknesses can be produced in less than an hour, for example in 30 minutes. The superconducting layers have a transition temperature $T_c = 90$ K.

Figure 2:
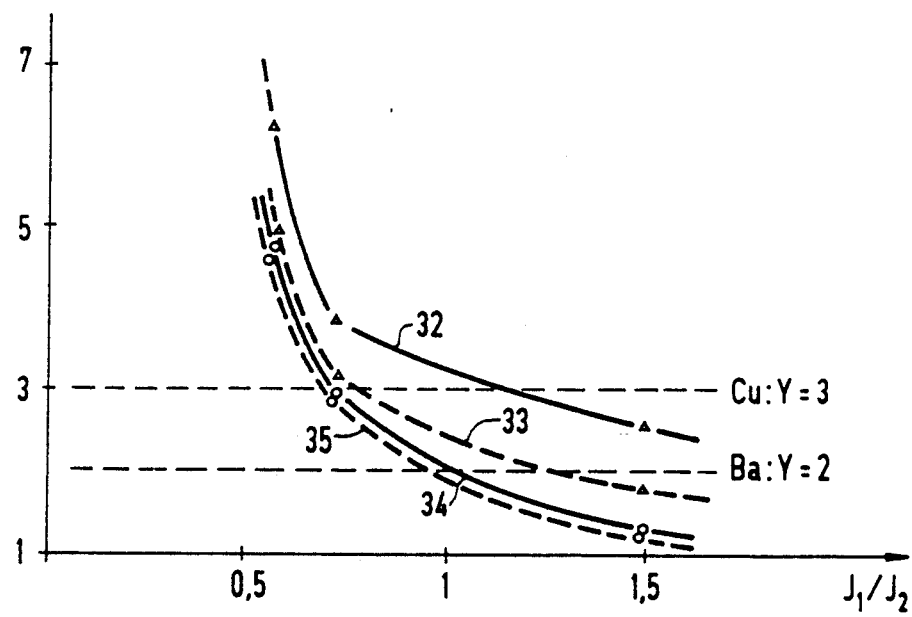
Figure 3:
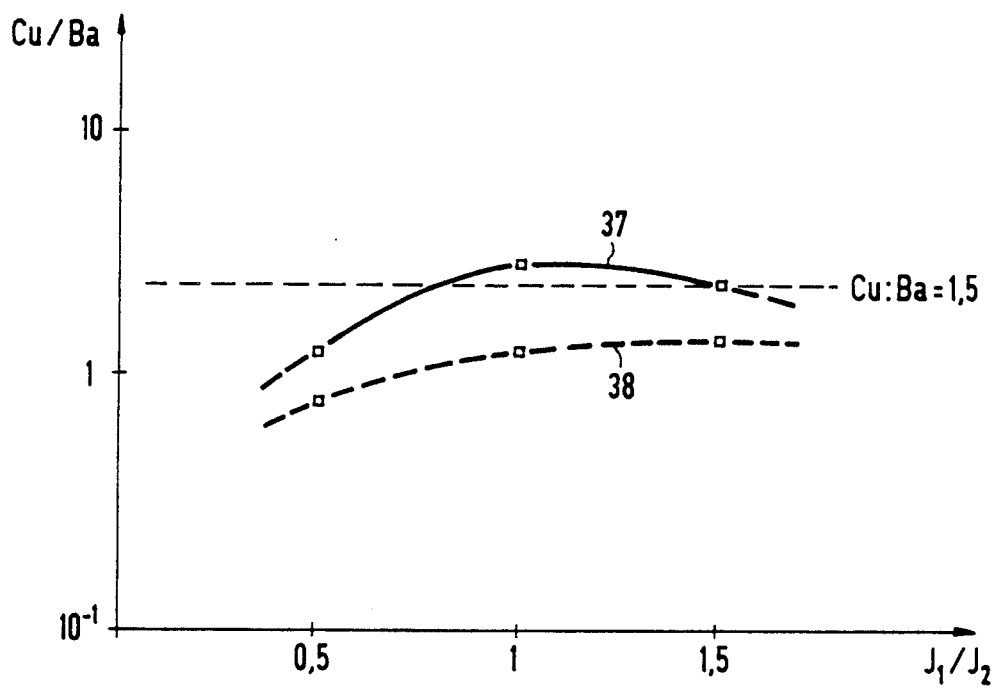

In test series the influence of the vaporizer currents on the concentration of the alloy components in the produced layer was determined, as shown in the diagrams of FIGS. 2 and 3. The diagrams represent the results of an ICP analysis (inductive coupled plasma) on finished HTSC layers, where in each instance the ratio of two elements of the three metal components yttrium, barium, copper of the $YBa_2Cu_3O_{7-\delta}$ superconductor is represented as a function of the ratio of the electric currents at the alloy cathodes.

In FIG. 2, and FIG. 3, the ratio of $I_1$ to $I_2$ is plotted on the abscissa; in the experimental tests the current $I_1$ at the alloy cathode 20 of YCu50 was kept approximately constant at 60 A and at the alloy cathode 30 of BaCu36 the current $I_2$ was varied. On the ordinate in FIG. 2 the ratio Cu/Y and Ba/Y is in linear representation and in FIG. 3 the ratio Cu/Ba logarithmic. The desired magnitudes for the stoichiometry are entered in each instance as parallels to the abscissa.

In FIG. 2, curve 32 represents the concentration Cu:Y in the untempered state of the layer and curve 33 the corresponding concentration in the tempered state of the layer. Curve 34 represents the concentration Ba:Y in the untempered state of the layer and curve 35 the corresponding concentration in the tempered state of the layer. In FIG. 3, curve 37 represents the concentration Cu:Ba in the untempered state and curve 38 the corresponding concentration in the tempered state of the layer.

An evaluation of the test results shows that with respect to the element ratios Y:Cu, Ba:Y and Cu:Ba the layer composition can be influenced in a controlled manner by a variation in the ratio of the vaporizer currents $I_1$ and $I_2$ of the two cathodes. In this way, at respective cathode compositions, the preset desired values can be reached. It appears that for this purpose the alloy composition in the first alloy cathode of BaCu should be raised to 50:50.

Analogous reasoning can be applied to the additional high temperature superconductors on the basis of bismuth on the one hand and thallium on the other hand. Specifically the bismuth may be substituted in part by lead.

In the described process the power density at the material source is favorable as a result of the system. In this way growth rates as high as could previously be achieved only by laser pulse vaporization are attainable for the HTSC layers Table 2 gives an up-to-date comparison with other processes for the production of HTSC layers. It compares the conventional cathode sputtering, which can take place with high frequency or a magnetron, with the laser vaporization generally deemed advantageous and with the arc vaporization according to the invention.

In the two methods mentioned in first place in Table 2 specially prepared HTSC material is used. However, in the process according to the invention metals and in particular alloys can be used as cathodes. By presetting the arc currents, the suitable composition of the HTSC layer can be obtained "in situ".

For laser and arc vaporizing alike, a considerably higher power density results than in cathode sputtering. The growth rate resulting therefrom specifically in arc vaporizing, of about 1.4 nm/s, may be above the growth rates in laser vaporization, which occurs in pulsed operation and in that respect depends also on the pulse frequency.

TABLE 1

Use of different alloys for the production of HTSC layers

| HTSC | $T_c$ | Alloy cathode 1 | Alloy cathode 2 |
|---|---|---|---|
| 1. $Y_1Ba_2Cu_3O_{7-}$ | 90K | BaCu 40:60–70:30 | YCu 40:60–60:40 |
| 2. $Bi_2Sr_2Ca_{n-1}Cu_nO_x$ | | BiSr 40:60–60:40 | CaCu 20:80–40:60 |
| — | | BiCuSr 15:70:15– 30:40:30 | BiCuCa 15:70:15– 30:40:30 |
| | | (Bi may be partially replaced by PB) | |
| n = 2:$Bi_2Sr_2Ca_1Cu_2O_x$ | 80K | | |
| n = 3:$Bi_2Sr_2Ca_2Cu_3O_x$ | 110K | | |
| 3. $Tl_2Ba_2Ca_{n-1}Cu_nO_y$ | | TlbA TlCuBa | CaCu TlCuCa |
| n = 2:$Tl_2Ba_2Ca_1Cu_2O_y$ | 105K | | |
| n = 3:$Tl_2Ba_2Ca_2Cu_3O_y$ | 125K | | |

TABLE 2

Comparison of various PVD processes for the production of HTSC layers

| | Cathode sputtering | | Laser pulse | |
| Source material | HF HTSC | Magnetron HTSC | vaporization HTSC | Arc vaporization Metals, alloys |
|---|---|---|---|---|
| Power density (W/cm²) | 2.3 | 4 | $3 \times 10^7$ | $2 \times 10^7$ |
| Growth rate (rm/s) | 0.1 | 0.3 | * ** 0.25–1.7 | 1.4 |

*Pulse frequency 1 Hz, KrF
**Pulse frequency 5 Hz, XeCl

What is claimed is:

1. A plasma-activated physical vapor deposition process for the production of thin layers of a high temperature superconductor having metallic and oxidic components comprising the steps of removing material from a cathode by a cathodic process, depositing the said material on a substrate, and adjusting the material by a heat treatment to achieve a structure and oxygen stoichiometry suitable for superconduction, wherein the cathodic process is an arc vaporization process with an arc between an anode and the cathode of the material to be removed and with one arc base on said cathode in which the arc base is moved on the cathode surface in a random or a controlled manner, wherein in the arc vaporization process at least two cathodes of different alloys or mixtures of the metallic components of the high temperature superconductor are activated for simultaneous vaporization by an arc for each, and wherein the materials vaporized from the different alloys are jointly deposited on the substrate, the arc vaporization process occurring reactively under an oxygen atmosphere of preset $O_2$ partial pressure to achieve the oxygen stoichiometry for superconduction.

2. A process according to claim 1, wherein the oxygen partial pressure is from $10^{-2}$ to $10^{-1}$ Pa.

3. A process according to claim 2, wherein the oxygen partial pressure is about $2 \times 10^{-2}$ Pa.

4. A process according to claim 1, wherein the substrate is heated.

5. A process according to claim 4, wherein the substrate is heated to 500° C.

6. A process according to claim 1, wherein the substrate is symmetrically arranged between the cathodes of the different alloys and is rotated periodically.

7. A process according to claim 1, wherein a variable accelerating voltage is applied to the substrate.

8. A process according to claim 7, wherein the variable accelerating voltage is not greater than 1000 V.

9. A process according to claim 1 for the production of Y-Ba-Cu-O layers, wherein a first cathode of barium-copper and a second cathode of yttrium-copper is used.

10. A process according to claim 9, wherein the first cathode of barium-copper has a composition between 40:60 and 60:40.

11. A process according to claim 9, wherein the second cathode of yttrium-copper has a composition between 40:60 and 60:40.

12. A process according to claim 1 for the production of Bi-Sr-Ca-Cu-O layers, wherein a first cathode of bismuth-strontium and a second cathode of copper-calcium is used.

13. A process according to claim 12, wherein the first cathode of bismuth-strontium has a composition between 40:60 and 60:40.

14. A process accoroing to claim 12, wherein the second cathode of copper-calcium has a composition between 80:20 and 50:50.

15. A process according to claim 1 for the production of Bi-Sr-Ca-Cu-O layers, wherein a first cathode of a bismuth-copper-strontium alloy and a second cathode of a bismuth-copper-calcium alloy is used.

16. A process according to claim 15, wherein the first cathode of bismuth-copper-strontium has a composition between 15:70:15 and 30:40:30.

17. A process according to claim 15, wherein the second cathode of bismuth-copper-calcium has a composition between 15:70:15 and 30:40:30.

18. A process according to claim 15 wherein in at least one of the first cathode and the second cathode the bismuth is partially substituted by lead.

19. A process according to claim 1 for the production of Tl-Ba-Ca-Cu-O layers, wherein a first cathode of a thallium-barium or thallium-copper-barium alloy and a second cathode of a copper-calcium or thallium-copper-calcium alloy is used.

* * * * *